United States Patent
Noda

(10) Patent No.: US 8,325,071 B2
(45) Date of Patent: Dec. 4, 2012

(54) CODING METHOD, CODING APPARATUS, DECODING METHOD, AND DECODING APPARATUS

(75) Inventor: Makoto Noda, Tokyo (JP)

(73) Assignee: Sony Corporation, Tokyo (JP)

( * ) Notice: Subject to any disclaimer, the term of this patent is extended or adjusted under 35 U.S.C. 154(b) by 140 days.

(21) Appl. No.: 12/902,648

(22) Filed: Oct. 12, 2010

(65) Prior Publication Data

US 2011/0115655 A1    May 19, 2011

(30) Foreign Application Priority Data

Nov. 13, 2009    (JP) .................................. 2009-259908

(51) Int. Cl.
*H03M 7/00*    (2006.01)
(52) U.S. Cl. .......................................... 341/59; 341/61
(58) Field of Classification Search ............ 341/58, 341/59, 61, 94
See application file for complete search history.

(56) References Cited

U.S. PATENT DOCUMENTS

| | | | |
|---|---|---|---|
| 5,220,568 A * | 6/1993 | Howe et al. .............. | 714/782 |
| 5,859,601 A | 1/1999 | Moon et al. | |
| 6,335,841 B1 | 1/2002 | Hirano et al. | |
| 7,174,485 B2 * | 2/2007 | Silvus ........................... | 714/701 |
| 7,224,296 B2 * | 5/2007 | Coene et al. .................... | 341/59 |
| 7,307,556 B2 * | 12/2007 | Lee ................................. | 341/59 |

OTHER PUBLICATIONS

Jaekyun Moon, et al., "Maximum Transition Run Codes for Data Storage Systems", IEEE Transactions on Magnetics, vol. 32, No. 5, Sep. 1996, pp. 3992-3994.
Emina Soljanin, et al., "Application of Distance Enhancing Codes", IEEE Transactions on Magnetics, vol. 37, No. 2, Mar. 2001, pp. 762-767.
John L. Fan, et al., "Constrained Coding Techniques for Soft Iterative Decoders", Global Telecommunications Conference—Globecom '99, pp. 723-727.
Hongxin Song, et al., "Applications of Low-Density Parity-Check Codes to Magnetic Recording Channels", IEEE Journal on Selected Areas in Communications, vol. 19, No. 5, May 2001, pp. 918-923.

* cited by examiner

*Primary Examiner* — Brian Young
(74) *Attorney, Agent, or Firm* — Oblon, Spivak, McClelland, Maier & Neustadt, L.L.P.

(57) ABSTRACT

Disclosed herein is a coding method including the step of: coding an information sequence in such a manner that upon performing error correction coding after carrying out RLL coding of the information sequence, the maximum number of consecutive 1-bits or 0-bits is $\alpha-\beta$ or less in an RLL code word over a range from bit $p-\alpha$ to bit $p+\alpha-1$ of the RLL code word and that a $\beta$-bit error correcting code parity sequence is inserted between bit $p-1$ and bit $p$ of the RLL code word, where $\alpha$ is a number larger than 1 representing the maximum number of consecutive 0-bits or 1-bits in an n-bit RLL code word and where p is a natural number.

11 Claims, 18 Drawing Sheets

FIG.7

| MAXIMUM RUN CONSTRAINT | SHANNON CAPACITY | |
|---|---|---|
| | MTR=3 | MTR=4 |
| 1 | 0.5515 | 0.6174 |
| 2 | 0.7947 | 0.8376 |
| 3 | 0.8791 | 0.9146 |
| 4 | 0.9146 | 0.9468 |
| 5 | 0.9306 | 0.9614 |
| 6 | 0.9388 | 0.9684 |
| 7 | 0.9427 | 0.9718 |
| 8 | 0.9447 | 0.9735 |

FIG.8

| 16-BIT INFORMATION WORD | 17-BIT TEMPORARY CODE WORD |
|---|---|
| 0000000000000000 | 00000100000010001 |
| 0000000000000001 | 00000100000010010 |
| 0000000000000010 | 00000100000010011 |
| 0000000000000011 | 00000100000010100 |
| 0000000000000100 | 00000100000010101 |
| 0000000000000101 | 00000100000010110 |
| 0000000000000110 | 00000100000011010 |
| 0000000000000111 | 00000100000011011 |
| ⋮ | ⋮ |

FIG. 9

| RULE NO. | BEFORE CONVERSION | AFTER CONVERSION |
|---|---|---|
| 1 | 0000, 0 | 0111, 0 |
| 2 | 0, 0000 | 0, 1110 |

FIG.12

| PARITY BIT POSITION | NO. OF CODE WORD CANDIDATES |
|---|---|
| BEFORE BIT 1 OR AFTER BIT 17 | 56270 |
| BEFORE BIT 2 OR AFTER BIT 16 | 54322 |
| BEFORE BIT 3 OR AFTER BIT 15 | 52532 |
| BEFORE BIT 4 OR AFTER BIT 14 | 62438 |
| BEFORE BIT 5 OR AFTER BIT 13 | 70477 |
| BEFORE BIT 6 OR AFTER BIT 12 | 68642 |
| BEFORE BIT 7 OR AFTER BIT 11 | 68360 |
| BEFORE BIT 8 OR AFTER BIT 10 | 68812 |
| BEFORE BIT 9 OR AFTER BIT 9 | 69031 |

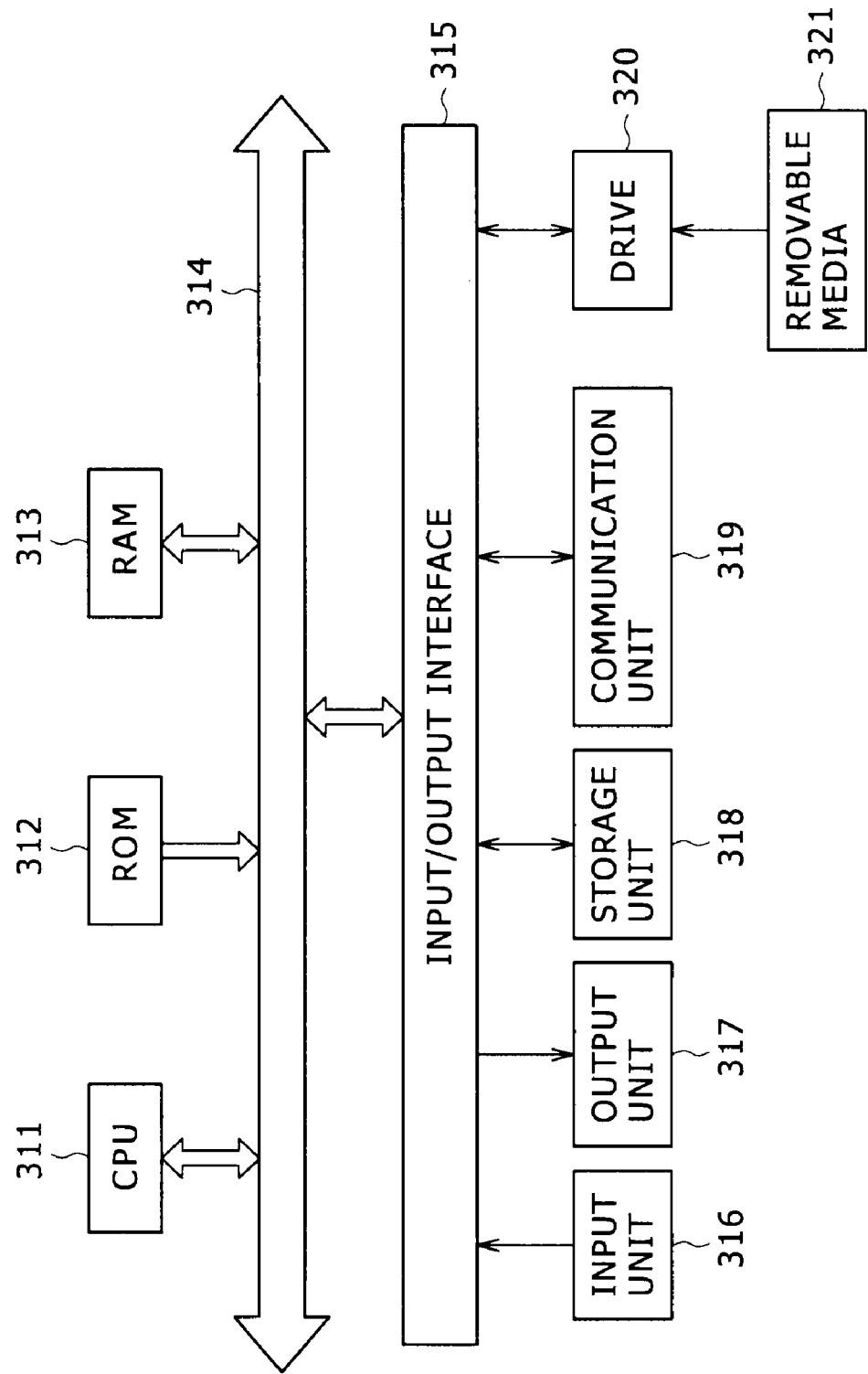

CODING METHOD, CODING APPARATUS, DECODING METHOD, AND DECODING APPARATUS

BACKGROUND OF THE INVENTION

1. Field of the Invention

The present invention relates to a coding method, a coding apparatus, a decoding method, and a decoding apparatus. More particularly, the invention relates to a coding method, a coding apparatus, a decoding method, and a decoding apparatus whereby, upon execution of ECC coding following RLL coding, the code constraints on RLL code sequences are not disturbed, additional bits that would degrade upon insertion the coding ratio of ECC parity sequences are not inserted, and both soft-decision decoding and hard-decision decoding are carried out easily on the decoding side.

2. Description of the Related Art

Numerous recording/reproduction devices and communication devices transmit input information sequences in code sequences in order to lower the error rate of digitally transmitted information.

FIG. 1 is a block diagram showing a configuration example of a recording and reproduction system 1.

As shown in FIG. 1, the recording and reproduction system 1 is constituted by a recording device 11 and a reproduction device 12. The recording device 11 is made up of a coding block 21 and a recording block 22. The reproduction device 12 is composed of a reproduction block 31, an A/D (analog/digital) conversion block 32, a code detection block 33, and a decoding block 34.

In FIG. 1, an information sequence (input information sequence) from the user's side is input to the coding block 21. The coding block 21 codes the input information sequence into a code sequence at a ratio of m/n, where "m" stands for information word length, "n" for code word length, and "m/n" for coding ratio. It is often the case with coding that a plurality of coding schemes such as encryption, error correction coding, and RLL (run-length-limited) coding are used in combination.

The code sequence is input to the recording block 22 that records the input sequence to a recording medium, not shown, using an optical pickup, a magnetic head or the like. The signal recorded to the recording medium is moved from there to the reproduction device 12.

The recorded signal coming from the recording device 11 is converted by the reproduction block 31 of the reproduction device 12 using an optical pickup, a magnetic head or the like, from the recording medium into an analog reproduced signal. An analog equalizer, not shown, is used to equalize the analog reproduced signal to a signal having target equalization characteristics, before the signal is converted by the A/D conversion block 32 into a digital received signal at predetermined time intervals. The A/D conversion block 32 includes a phase synchronization circuit, not shown.

The code detection block 33 converts the digital received signal into a detected code sequence or a posterior probability information sequence thereof. The detected code sequence or posterior probability information sequence is input to the decoding block 34 whereby the input sequence is decoded at a ratio of n/m into a detected information word that constitutes a detected information sequence.

If the equalization by the analog equalizer is considered insufficient, a digital equalizer may be interposed between the A/D conversion block 32 and the code detection block 33. In recent years, the practice of getting the code detection block 33 to use a soft-decision detector such as a Viterbi detector has become prevalent. Furthermore, if the decoding block 34 adopts an iterative decoding scheme, the code detection block 33 may be configured to utilize a posterior probability detector capable of soft-decision input and soft-decision output.

A variety of codes have been studied for use by the coding block 21 in FIG. 1. With storage systems, in particular, the RLL code and ECC (error correcting code) are often employed in combination.

The Reed-Solomon code has long been practiced as a representative ECC. With communication systems, low-density parity-check codes capable of high levels of error detection have also been put to practical use in recent years.

Of the RLL codes, those with their maximum number of consecutive 0-bits (i.e., maximum run length) limited to "k" and their minimum number of consecutive 0-bits (minimum run length) limited to "d" in a code sequence prior to NRZI modulation are generally referred to as (d, k) RLL codes. Incidentally, NRZI (non-return to zero on one) modulation is a modulation system whereby the polarity of a recorded or transmitted signal is inverted at 1's and kept unchanged at 0's.

A code in which the number of continuous transitions in a recorded or transmitted coded sequence is limited is called the MTR (maximum transition run) code. With the MTR code, the maximum number of consecutive 1-bits falls between 2 and a larger but finite number in the code sequence prior to NRZI modulation. The code of which the maximum number of consecutive 1-bits prior to NRZI modulation is limited to 1 is not generally called the MTR code since the code is the same as the minimum RLL code known for many years. The MTR code is disclosed illustratively in the U.S. Pat. No. 5,859,601, January 1999, by J. Moon and B. Brickner (called Patent Document 1 hereunder) and in IEEE Trans. Magn. 32, p. 3992, 1996, by J. Moon and B. Brickner (called Non-Patent Document 1 hereunder).

The above-cited Patent Document 1 and Non-Patent Document 1 discuss the possibility that if the maximum run is 8 or more, then the code MTR=2 can be structured to provide a coding ratio of 7/8.

Although the expression MTR was used in Non-Patent Document 1 for the first time, the codes with their maximum number of consecutive 1-bits limited prior to NRZI modulation had been known before (e.g., Nyquist constraint codes).

The major characteristic of the MTR code is this: that by limiting the maximum number of consecutive 1-bits to a small number, the code allows a detector trellis dealing with the received signal having undergone partial response equalization to remove or reduce code sequences whose squared Euclidean distance is appreciably short, thereby affording coding gain to the system in use.

Even where the maximum number of consecutive 1-bits in the code is limited, if that number is appreciably large, the coding gain involved is very small. For this reason, the codes with their maximum number of consecutive 1-bits limited to 2 through 4 to enhance coding gain are often called MTR codes. The performance of the MTR codes with their maximum number of consecutive 1-bits limited to 2 through 4 is illustratively disclosed in detail by E. Solijanin in "Application of Distance Enhancing Codes," IEEE Trans. Magn., Vol. 37, No. 2. pp. 762-767, March 2001 (called Non-Patent Document 2 hereunder).

If the signal-to-noise ratio (SNR) of the received signal remains constant, then the MTR constraint is strong. That is, the smaller the maximum number of consecutive 1-bits, the larger the gain for the code detector in use. However, reinforcing the MTR constraint generally lowers the coding ratio that can be attained and degrades the SNR. Thus how strong the MTR constraint should preferably be on a given code is correlated to the signal transmission characteristics of the system in use.

Since the MTR code is a code with its maximum run length of 1-bits limited, that code may be considered a sort of RLL code in a wider sense. In practice, the MTR codes have their maximum run length of 0-bits subject to a constraint as well.

Where the RLL code and ECC are used in combination as mentioned above, there are two ways to make up the combination: RLL coding is carried out after ECC (after ECC parity bits are added), or ECC coding is performed after RLL coding. The latter arrangement has been studied extensively in recent years because it can achieve error correction without being adversely affected by error propagation due to RLL decoding. The result is frequently a larger coding gain than before.

FIG. 2 is a block diagram showing a composition example of the coding block 21 that carries out ECC coding after RLL coding.

In FIG. 2, the input information sequence is fed to an RLL coding section 51 for RLL coding at the ratio of $m_1/n_1$ then outputted to an ECC parity generation section 52 and a selection section 53. Here, $m_1$ and $n_1$ are a natural number each and $m_1$ is smaller than $n_1$.

The ECC parity generation section 52 generates and outputs ECC parity bits.

The selection section 53 selects successively an RLL code sequence output from the RLL coding section 51 and a parity sequence output from the ECC parity generation section 52, and outputs the selected sequence as a code sequence.

In the coding setup of FIG. 2, there is no constraint on the run length of the parity sequence. This generally leads to the problem of the code sequence being highly subject to deterioration in terms of the minimum run length constraint, MTR constraint, and maximum run length constraint.

A number of methods have been known for easing the problem of deterioration in terms of the MTR constraint and RLL resulting from parity insertion.

A first method involves interleaving the ECC parity sequence with the RLL code sequence before ECC coding in the coding setup of FIG. 2. That is, the parity sequence is periodically inserted into the RLL code sequence before ECC coding. This method is disclosed illustratively by J. L. Fan and J. M. Cioffi in "Constrained Coding Techniques for Soft Iterative Decoders," Proc. IEEE (Globecom '99), pp. 723-727 (called Non-Patent Document 3 hereunder).

According to the method disclosed in Non-Patent Document 3, if the character $\alpha$ is assumed to represent the maximum run length of the RLL code sequence before parity insertion, then the maximum run length of the code sequence after parity insertion deteriorates down to $\alpha+\epsilon$, where $\epsilon$ stands for a natural number. If the coding ratio of ECC is larger than $\alpha/(\alpha+\epsilon)$, then the number $\epsilon$ may be the smallest natural number 1.

However, the method disclosed in Non-Patent Document 3 has one problem: where the RLL code sequence is subject to the minimum run length constraint and MTR constraint, the use of this method can degrade these constraints by at least one order of magnitude.

Generally, even if the maximum run length constraint on the RLL code sequence is degraded by one order of magnitude, it does not trigger appreciable deterioration in system performance. However, the minimum run length constraint or MTR constraint can significantly worsen system performance if degraded by one order of magnitude.

One way to bypass the above problem is to perform first RLL coding on the input information sequence and second RLL coding on the ECC parity sequence, before inserting a second RLL code sequence periodically into a first RLL code sequence. This method is disclosed by H. Song, R. M. Todd and J. R. Cruz in "Application of Low-density Parity-check Codes to Magnetic Recording Channels," IEEE Trans. on Sel. Areas in Comm., Vol. 19, No. 5, pp. 918-923, May 2001 (called Non-Patent Document 4 hereunder).

FIG. 3 is a block diagram showing another composition example of the coding block 21 that performs second RLL coding on an ECC parity sequence.

In FIG. 3, those components also found in FIG. 2 are designated by like reference numerals. The structure in FIG. 3 differs from the structure in FIG. 2 in that an RLL coding section 54 performing second RLL coding on the ECC parity sequence is located downstream of the ECC parity generation section 52.

In FIG. 3, the input information sequence is fed to the RLL coding section 51 for first RLL coding at the ratio of $m_1/n_1$. The information sequence thus coded is input to the ECC parity generation section 52 and selection section 53.

The ECC parity generation section 52 generates and outputs parity bits. The parity sequence output from the ECC parity generation section 52 is forwarded to the RLL coding section 54 for second RLL coding at a ratio of $m_2/n_2$, where $m_2$ and $n_2$ are a natural number each and $m_2$ is smaller than $n_2$.

The selection section 53 selects periodically the sequence output from the RLL coding section 51 and the sequence from the RLL coding section 54. The selected sequence is output as a code sequence.

According to the method described in Non-Patent Document 4, a simple bit insertion technique is adopted to implement second RLL coding. This arrangement is intended to facilitate soft-decision decoding that may be used for ECC decoding on the decoding side. If a complicated technique were utilized in carrying out second RLL coding, then it would become necessary to perform complicated soft-decision decoding upon ECC decoding, which would require installing a complex decoding circuit.

The coding setup of FIG. 3 has the advantage of preventing the code constraint on the RLL code sequence before ECC coding from getting degraded after ECC coding. On the other hand, the total coding ratio can become worse than $m_1/n_1$ under the influence of the coding ratio of $m_2/n_2$ at the RLL coding section 54.

The above problem is circumvented by the technique of performing first RLL coding on the input information sequence and inserting the ECC parity sequence into the RLL code sequence before carrying out second RLL coding at the coding ratio of 1. This technique is disclosed illustratively by A. Hirano, S. Mita, and Y. Watanabe in "Coding Apparatus and Coding Method," U.S. Pat. No. 6,335,841 B1, January 2002 (called Patent Document 2 hereunder).

FIG. 4 is a block diagram showing another composition example of the coding block 21 which is disclosed in the above-cited Patent Document 2 and which carries out second RLL coding at the coding ratio of 1 after inserting the ECC parity sequence into a first RLL code sequence.

In FIG. 4, those components also found in FIG. 2 are designated by like reference numerals. The structure in FIG. 4 differs from the structure in FIG. 2 in that an RLL coding section 55 is installed to perform second RLL coding at the coding ratio of 1 on the sequence output from the selection section 53.

In FIG. 4, the input information sequence is fed to the RLL coding section 51 for first RLL coding at the ratio of m/n. The RLL code sequence is output to the ECC parity generation section 52 and to the selection section 53.

The ECC parity generation section 52 generates and outputs ECC parity bits.

The selection section 53 periodically selects the RLL code sequence output from the RLL coding section 51 and the parity sequence output from the ECC parity generation section 52, and outputs the selected sequence.

The sequence output from the selection section 53 is forwarded to the RLL coding section 55 for second RLL coding at the coding ratio of 1. The RLL coding section 55 outputs the result of the coding as a code sequence.

In the structure described in the above-cited Patent Document 2, not all RLL coding is carried out by the RLL coding section 51 in FIG. 4; the RLL coding section 55 is used to accomplish the whole RLL coding desired. As an example of code conversion by the RLL coding section 55, if a sequence of [0001,1,1100] is given to represent the last 4 bits of the preceding first RLL code word, a parity 1-bit, and the first 4 bits of the current first RLL code word, then the sequence is converted to [0001,0,1110].

SUMMARY OF THE INVENTION

The problems with the ordinary method of performing ECC coding after carrying out RLL coding are summarized as follows:

As shown in FIG. 2, if RLL coding is carried out on the input information sequence and if an ECC parity sequence is inserted periodically into the sequence before ECC coding, then the code constraint on RLL coding is degraded by at least one order of magnitude.

As shown in FIG. 3, if first RLL coding is performed on the input information sequence and if second RLL coding is carried out on the parity sequence before the ECC parity sequence is inserted periodically into the code sequence prior to ECC coding, then the code constraint on the first RLL coding is protected but second RLL coding leads to the deterioration of the coding ratio.

As shown in FIG. 4, if first RLL coding is effected on the input information sequence and if an ECC parity sequence is periodically inserted into the RLL code sequence before the coded sequence is subjected to second RLL coding at the coding ratio of 1, then there is no problem with decoding the ECC parity sequence through hard decision but soft decision turns out to be difficult.

For example, if coding is performed by the technique disclosed in Patent Document 2 and soft decision is made upon decoding, then the decoding of the sequence coded by second RLL coding requires calculating the confidence of each of eight consecutive information bits by referencing a maximum of 13-consecutive-bit received signal sequence. It is not easy to design a circuit capable of soft-decision decoding at such a high level of precision.

That is, as the technique of performing ECC coding after carrying out RLL coding on the input information sequence, there has yet to be proposed a coding method satisfying three conditions at the same time: (1) the code constraint on the RLL code sequence is not disturbed; (2) additional bits entailing the degradation of the coding ratio are not inserted; and (3) both soft-decision decoding and hard-decision decoding can be performed easily.

The present invention has been made in view of the above circumstances and provides a coding method, a coding apparatus, a decoding method, and a decoding apparatus whereby the above three conditions are met, i.e., the code constraint on the RLL code sequence is not disturbed; additional bits entailing the degradation of the coding ratio are not inserted into the ECC parity sequence; and both soft-decision decoding and hard-decision decoding can be performed easily on the decoding side.

In carrying out the present invention and according to one embodiment thereof, there is provided a coding method including the step of coding an information sequence in such a manner that upon performing error correction coding after carrying out RLL coding of the information sequence, the maximum number of consecutive 1-bits or 0-bits is $\alpha-\beta$ or less in an RLL code word over a range from bit $p-\alpha$ to bit $p+\alpha-1$ of the RLL code word and that a $\beta$-bit error correcting code parity sequence is inserted between bit $p-1$ and bit p of the RLL code word, where a is a number larger than 1 representing the maximum number of consecutive 0-bits or 1-bits in an n-bit RLL code word and where p is a natural number.

Preferably, p may represent a plurality of natural numbers.

Preferably, if the coding ratio of the RLL code is represented by m/n where m is a natural number, then the coding ratio of the error correcting code may be defined as $m/(n+\beta)$.

Preferably, $\beta$ may be 1.

Preferably, m may be 16 and n may be 17.

Preferably, the maximum number $\alpha$ of consecutive 1-bits may be 4, the maximum number $\alpha$ of consecutive 0-bits may be 6, and p may be 5.

According to another embodiment of the present invention, there is provided a coding apparatus including coding means for coding an information sequence in such a manner that upon performing error correction coding after carrying out RLL coding of the information sequence, the maximum number of consecutive 1-bits or 0-bits is $\alpha-\beta$ or less in an RLL code word over a range from bit $p-\alpha$ to bit $p+\alpha-1$ of the RLL code word and that a $\beta$-bit error correcting code parity sequence is inserted between bit $p-1$ and bit p of the RLL code word, where $\alpha$ is a number larger than 1 representing the maximum number of consecutive 0-bits or 1-bits in an n-bit RLL code word and where p is a natural number.

According to a further embodiment of the present invention, there is provided a decoding method including the steps of: detecting a code sequence obtained by coding an information sequence in such a manner that upon performing error correction coding after carrying out RLL coding of the information sequence, the maximum number of consecutive 1-bits or 0-bits is $\alpha-\beta$ or less in an RLL code word over a range from bit $p-\alpha$ to bit $p+\alpha-1$ of the RLL code word and that a $\beta$-bit error correcting code parity sequence is inserted between bit $p-1$ and bit p of the RLL code word, where $\alpha$ is a number larger than 1 representing the maximum number of consecutive 0-bits or 1-bits in an n-bit RLL code word and where p is a natural number; deleting the error correcting code parity sequence from the detected code sequence; and performing RLL decoding of the code sequence from which the error correcting code parity sequence has been deleted.

According to an even further embodiment of the present invention, there is provided a decoding apparatus including: detection means for detecting a code sequence obtained by coding an information sequence in such a manner that upon performing error correction coding after carrying out RLL coding of the information sequence, the maximum number of consecutive 1-bits or 0-bits is $\alpha-\beta$ or less in an RLL code word over a range from bit $p-\alpha$ to bit $p+\alpha-1$ of the RLL code word and that a $\beta$-bit error correcting code parity sequence is inserted between bit $p-1$ and bit p of the RLL code word, where $\alpha$ is a number larger than 1 representing the maximum number of consecutive 0-bits or 1-bits in an n-bit RLL code word and where p is a natural number; deletion means for deleting the error correcting code parity sequence from the code sequence detected by the detection means; and decoding means for performing RLL decoding of the code sequence from which the error correcting code parity sequence has been deleted by the deletion means.

According to the embodiment of the present invention outlined above, an information sequence is coded in such a manner that when error correction coding is performed after RLL coding of the information sequence is carried out, the maximum number of consecutive 1-bits or 0-bits is $\alpha-\beta$ or less in an RLL code word over a range from bit $p-\alpha$ to bit $p+a-1$ of the RLL code word and that a $\beta$-bit error correcting code parity sequence is inserted between bit $p-1$ and bit p of the RLL code word, where $\alpha$ is a number larger than 1 representing the maximum number of consecutive 0-bits or 1-bits in an n-bit RLL code word and where p is a natural number.

Also according to another embodiment of the present invention outlined above, a code sequence is first detected which is obtained by coding an information sequence in such a manner that upon performing error correction coding after carrying out RLL coding of the information sequence, the maximum number of consecutive 1-bits or 0-bits is $\alpha-\beta$ or less in an RLL code word over a range from bit $p-\alpha$ to bit $p+\alpha-1$ of the RLL code word and that a $\beta$-bit error correcting code parity sequence is inserted between bit $p-1$ and bit p of the RLL code word, where $\alpha$ is a number larger than 1 representing the maximum number of consecutive 0-bits or 1-bits in an n-bit RLL code word and where p is a natural number. The error correcting code parity sequence is then deleted from the detected code sequence. Thereafter, RLL decoding is performed on the code sequence from which the error correcting code parity sequence has been deleted.

When the present invention is embodied as outlined above, the code constraint on the RLL code sequence is not disturbed; additional bits entailing the degradation of the coding ratio are not inserted into the ECC parity sequence; and both soft-decision decoding and hard-decision decoding can be performed easily on the decoding side.

BRIEF DESCRIPTION OF THE DRAWINGS

Further features and advantages of the present invention will become apparent upon a reading of the following description and appended drawings in which:

FIG. 7 is a tabular view listing Shannon capacities;

FIG. 8 is an example of a code conversion table;

FIG. 9 is an example of a code conversion table applicable upon violation;

FIG. 12 is a tabular view showing relations between parity bit positions on the one hand and the numbers of code word candidates on the other hand;

FIG. 18 is a block diagram showing a composition example of a personal computer.

DETAILED DESCRIPTION OF THE PREFERRED EMBODIMENTS

[Composition Example of a Coding Block]

Figure 5:
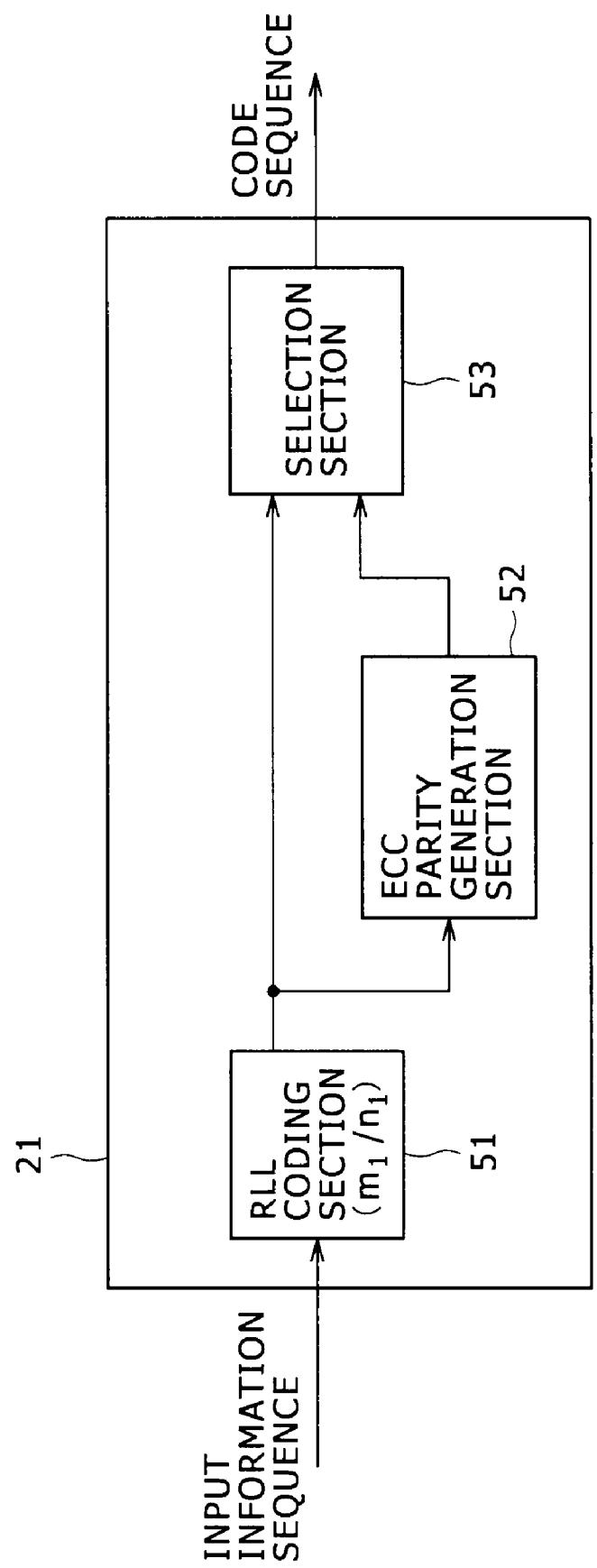
FIG. 5 is a block diagram showing a composition example of a coding block in a recording device as part of a recording and reproduction system embodying the present invention.

FIG. 5 is a block diagram showing a composition example of a coding block 21 embodying the present invention.

An input information sequence is fed to an RLL coding section 51 for RLL coding at the ratio of $m_1/n_1$. The RLL code sequence is input to an ECC parity generation section 52 and to a selection section 53.

The ECC parity generation section 52 generates and outputs ECC parity bits.

The selection section 53 selects successively the RLL code sequence output from the RLL coding section 51 and a parity sequence output from the ECC parity generation section 52, and outputs the selected sequence as a code sequence.

Figure 2:
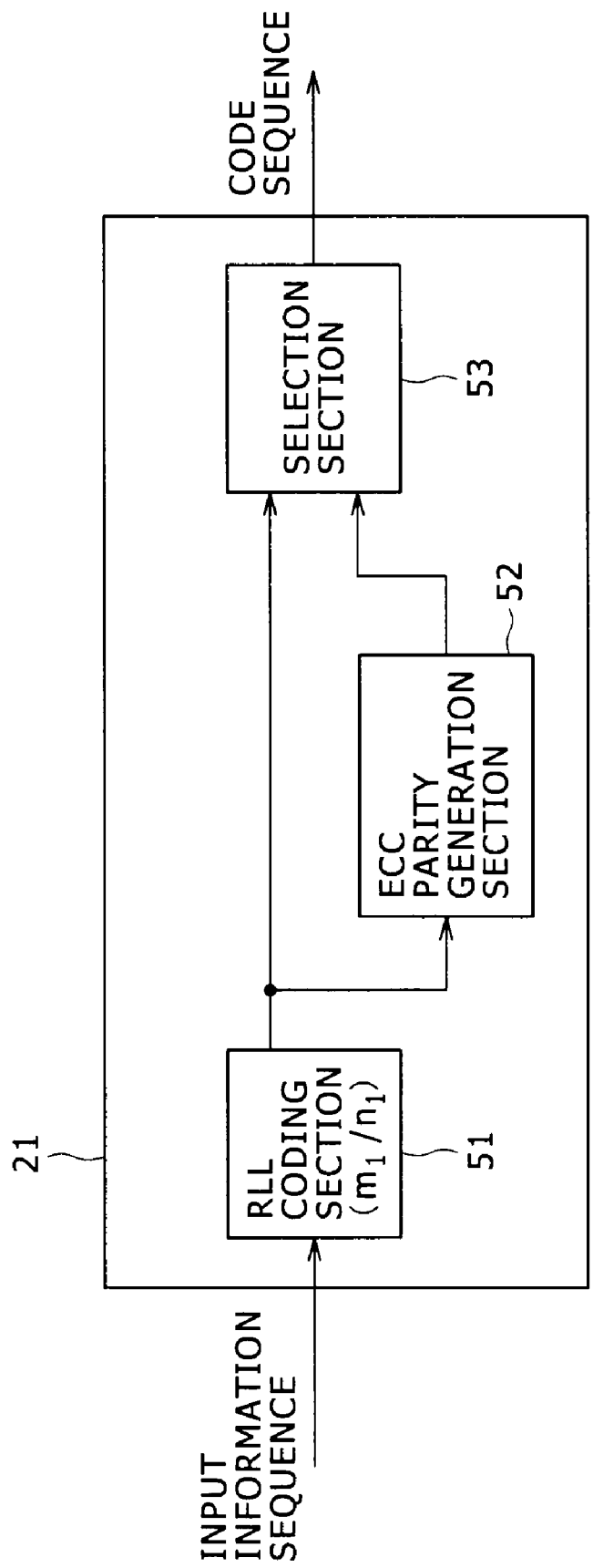
FIG. 2 is a block diagram showing a composition example of an ordinary coding block.
Figure 3:
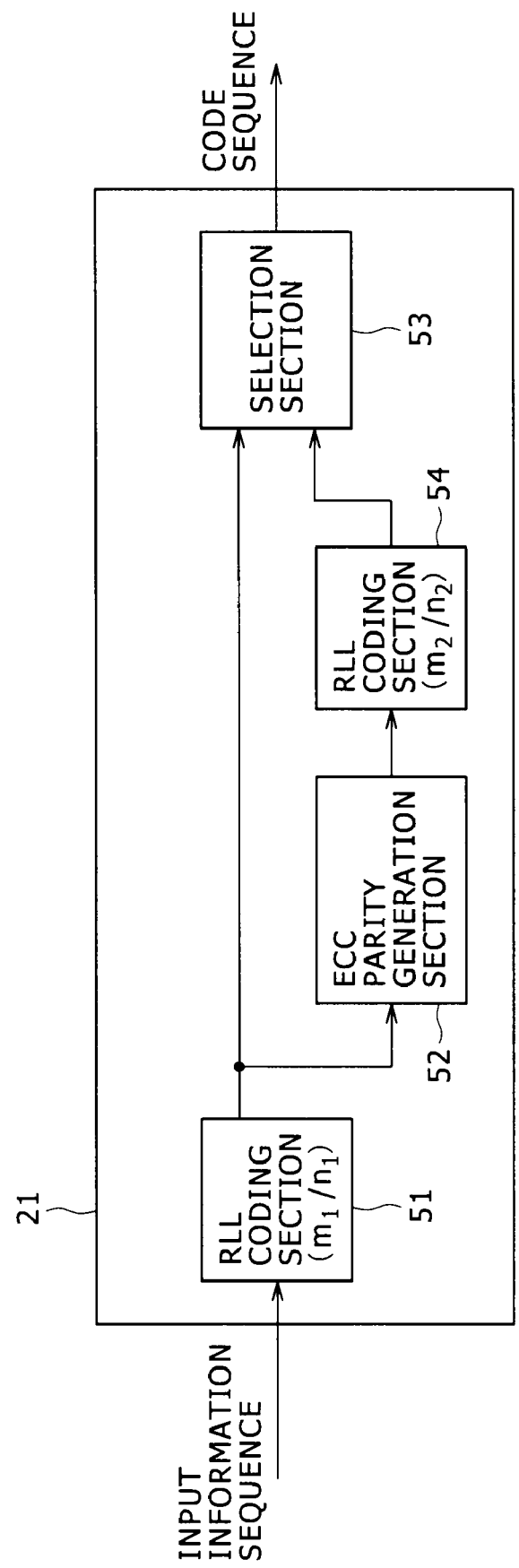
FIG. 3 is a block diagram showing another composition example of the ordinary coding block.
Figure 4:
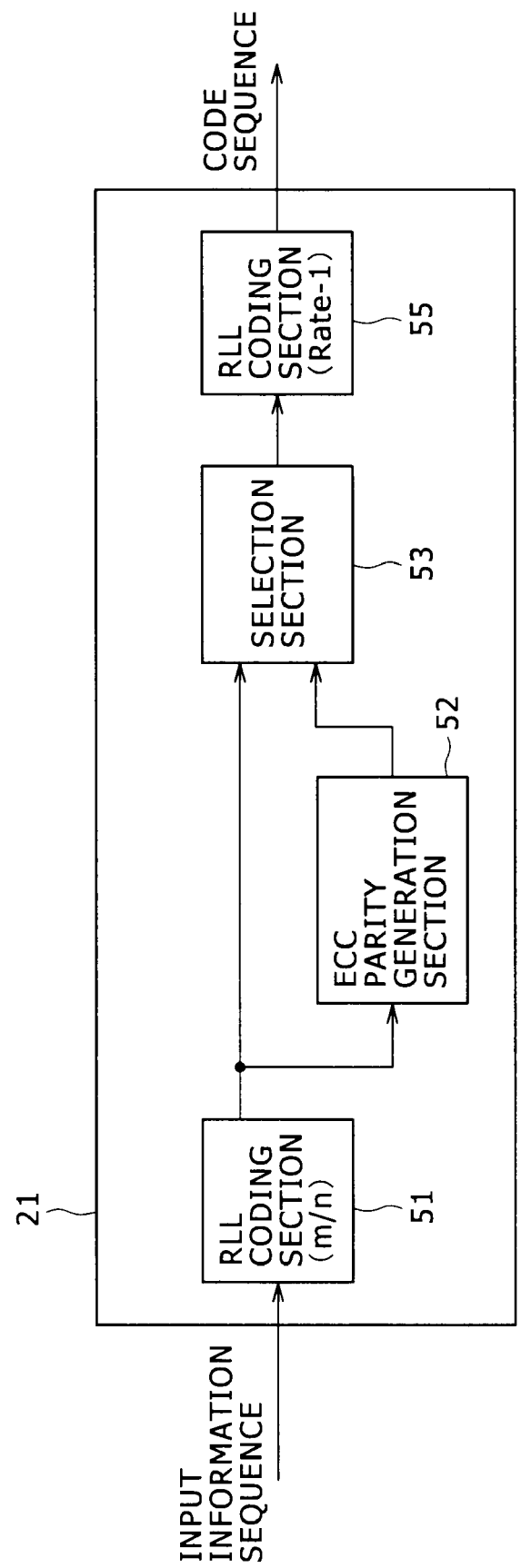
FIG. 4 is a block diagram showing a further composition example of the ordinary coding block.

The structure in FIG. 5 is basically the same as the structure of the coding block 21 shown in FIG. 2. The differences lie in the way the RLL coding section 51 performs RLL coding, the way the ECC parity generation section 52 generates ECC parity bits, and the way the selection section 53 selects the position in which to insert the parity bit.

For example, according to the technique disclosed in Patent Document 2, an ECC parity bit for the RLL code sequence is inserted into the connecting point between two RLL code words of the sequence. In the structure of FIG. 5, an ECC parity bit is inserted halfway through an RLL code word while the run length constraint on the proximity of the parity bit position is strengthened compared with on the other positions. This arrangement allows parity bits to be inserted without degrading the run length constraint in effect prior to parity bit insertion.

Illustratively, with this embodiment, the RLL coding section 51 in FIG. 5 adopts 16/17 RLL code and the ECC parity generation section 52 utilizes (2448, 2312) ECC such as a low-density parity-check code. The RLL code used for this embodiment is a variation of the RLL code disclosed by this applicant in Japanese Patent Laid-open No. 2008-219477, the code being reinforced with further constraints.

What follows is an explanation of the 16/17 RLL code used for this embodiment.

Figure 6:
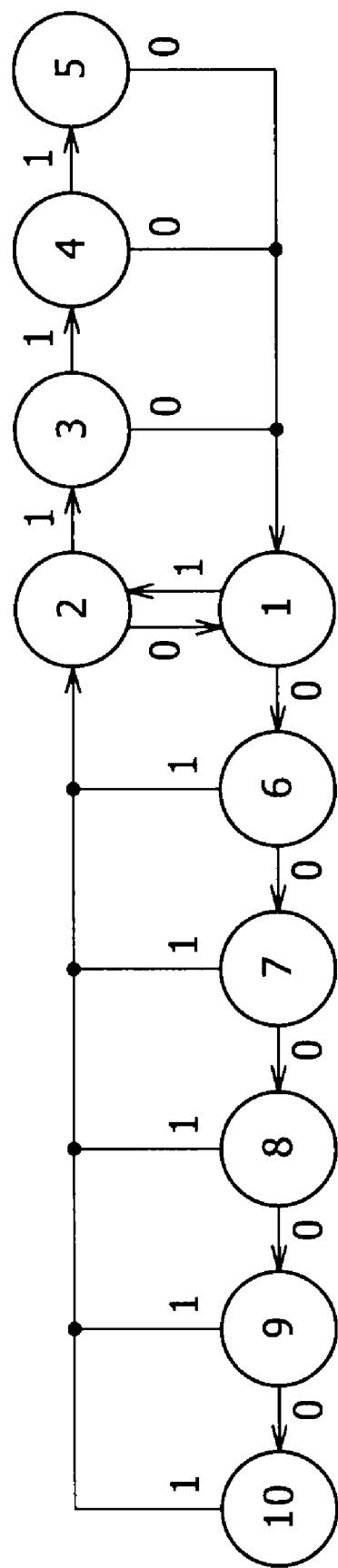
FIG. 6 is a finite state transition diagram of a code sequence subject to the constraints of MTR=4 and a maximum run length of 6.

FIG. 6 is a finite state transition diagram of a code sequence subject to the constraints of MTR=4 and a maximum run length of 6, the number of states being 10.

In the finite state transition diagram of FIG. 6, the Shannon capacity (where MTR=4 and the maximum run length is 6) is 0.9684. This is larger than the coding ratio of 16/17 (0.9411 . . . ). For that reason, it is possible to construct a 16/17 code that will meet the constraints of MTR=4 and the maximum run length of 6.

The Shannon capacity is a theoretical maximum coding ratio that can be achieved by a given code subject to constraints. That is, it is theoretically possible to design a code with a coding ratio less than Shannon capacity. FIG. 7 is a tabular view listing typical Shannon capacities obtained by varying the maximum run constraint on the assumption that MTR=3 or MTR=4. As shown in FIG. 7, when MTR=4, the Shannon capacity for the code sequence subject to the maximum run constraint of 6 is 0.9684.

Although the 16/17 code satisfying the constraints in FIG. 6 can be constituted by a fixed-length conversion code, this embodiment is arranged to utilize a variable-length code for coding. The reason for this is that variable-length coding entails more 17-bit sequences that can become code word candidates and thus makes it easier to enforce code constraints other than the MTR and maximum run length constraints. This contributes to facilitating the design of codes with better performance. Although code constraints other than the MTR and maximum run length constraints are optional, a generally conceived constraint may be a maximum run length in effect when an NRZI-modulated code sequence is observed every other bit.

Consider a bit sequence in which the maximum number of consecutive 1-bits at the beginning and end of a code word is limited to 2, the maximum number of consecutive 0-bits at the beginning and end of the code word is limited to 6, the maximum number of consecutive 1-bits halfway through the code word is limited to 4, and the maximum number of consecutive 0-bits halfway through the code word is limited to 6.

As shown in the finite state transition diagram of FIG. 6, both a "0" and a "1" are output in states 1 through 4 and 6 through 9; only a "0" is output in state 5; and only a "1" is output in state 10. Under these conditions, with the maximum number of consecutive 0-bits allowed to be 6 (in the diagram of FIG. 6, the maximum number of consecutive 0-bits does not exceed 6), it is state 3 that has the maximum number of consecutive 1-bits limited to 2 or less when placed at the beginning of the code word. When placed at the end of the code word, each of states 1, 2, 3, 6, 7, 8, 9 and 10 (i.e., other than states 4 and 5) has the maximum number of consecutive 1-bits limited to 2 or less.

Now consider a bit sequence that begins in state 3 and ends in one of states 1, 2, 3, 6, 7, 8, 9 and 10 in the finite state transition diagram of FIG. 6. There exist a total of 78,943 17-bit sequences that meet the above constraints. From these sequences, 65,536 ($=2^{16}$) temporary code words are selected.

That is, allocating temporary code words according to the finite state transition diagram of FIG. 6 generates a code conversion table of which a portion is shown in FIG. 8.

FIG. 8 shows a code conversion table covering the first eight words generated when temporary codes are allocated to 65,536 ($=2^{16}$)) information words according to the finite state transition diagram of FIG. 6.

In the code conversion table of FIG. 8, the left-hand column indicates 16-bit information words and the right-hand column presents 17-bit temporary code words corresponding to the 16-bit information words on the left. The code conversion table of FIG. 8 is used to allocate temporary code words to information words. For example, as indicated by row 1 in FIG. 8, a 16-bit information word "0000000000000000" is converted to a 17-bit temporary word "00000100000010001."

In the code conversion table of FIG. 8, the maximum number of consecutive 1-bits at the beginning and end of a code word is limited to 2 and the maximum number of consecutive 0-bits at the beginning and end of the code word is limited to 4 through 10. The code conversion table of FIG. 8 shows only eight code conversion rules out of a total of 65,536 code conversion rules that exist. The allocation of temporary code words to information words is optional.

As described above, the RLL coding section 51 in FIG. 5 converts 16-bit information words successively into 17-bit temporary code words in accordance with the code conversion table of FIG. 8.

It should be noted that following the conversion as per the code conversion table of FIG. 8, the maximum run length at the connecting point between code words becomes 12. Upon such a violation of the constraint on the maximum run length being 6 at the connecting point between code words after conversion to a temporary code word, the RLL coding section 51 performs further code conversion in keeping with a code conversion table applicable upon violation.

FIG. 9 shows a typical code conversion table applicable upon violation.

In FIG. 9, a comma (,) indicates the boundary between two contiguous code words. If the number of consecutive 0-bits at the connecting point between temporary code words does not exceed the constraint of a predetermined maximum run length, then the code conversion table applicable upon violation in FIG. 9 need not be applied. The ensuing description presupposes that a first temporary code word obtained using the code conversion table of FIG. 8 is called the temporary code word 1 and that a second temporary code word acquired using the table of FIG. 8 is called the temporary code word 2.

In the code conversion table applicable upon violation in FIG. 9, rule No. 1 indicates that if the last 4 bits of the temporary code word 1 are "0000" and if the first bit of the temporary code word 2 is "0," then the last 4 bits of the temporary code word 1 are converted to "0111" and the first 1 bit of the temporary code word 2 is converted to "0."

Likewise, rule No. 2 indicates that if the last 1 bit of the temporary code word 1 is "0" and if the first 4 bits of the temporary code word 2 are "0000," then the last 1 bit of the temporary code word 1 is converted to "0" and the first 4 bits of the temporary code word 2 are converted to "1110."

If the last 4 bits of the temporary code word 1 are "0000" and if the first 4 bits of the temporary code word 2 are "0000," then the violation rules of rule No. 1 and rule No. 2 are met at the same time. In such a case, either one of rule No. 1 and rule No. 2 may take precedence over the other.

When code conversion is carried out as needed according to the code conversion table applicable upon violation in FIG. 9, it becomes possible to limit the maximum number of consecutive 0-bits at the connecting point between temporary code words to 6. The RLL coding section 51 converts part of temporary code words in accordance with the code conversion table applicable upon violation and outputs the code words obtained through the conversion. The RLL code output from the RLL coding section 51 (i.e., 16/17 RLL code) constitutes a code sequence in which the maximum run length of 0-bits is 6 and the maximum run length of 1-bits is 4.

Figure 10:
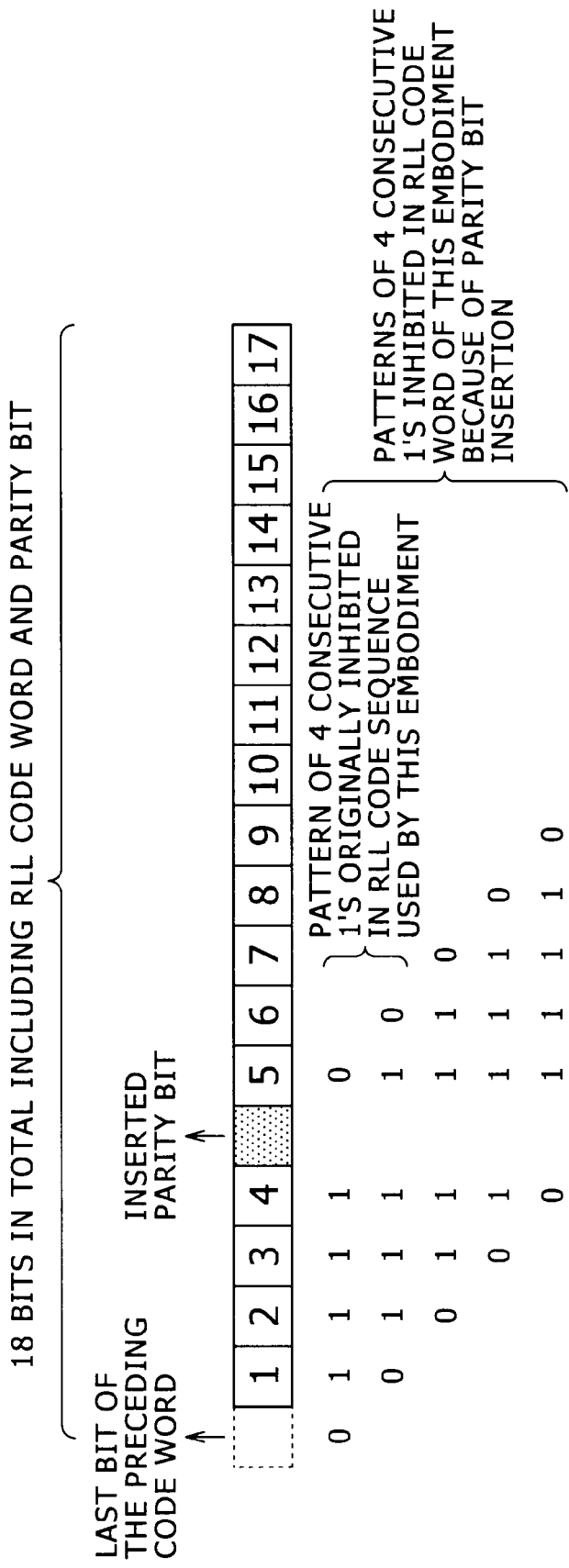
FIG. 10 is a schematic view showing the position in which to insert a 1 parity bit, along with typical additional constraints on consecutive 1-bits.

FIG. 10 is a schematic view showing the position in which to insert a 1 ECC parity bit generated by the ECC parity generation section 52, along with additional constraints on consecutive 1-bits.

As shown in FIG. 10, an ECC parity 1-bit or 0-bit generated by the ECC parity generation section 52 is inserted between bit 4 and bit 5 relative to the beginning of a 16/17 code output from the RLL coding section 51.

Even where the one ECC parity bit to be inserted is "1," the constraint of the maximum number of consecutive 1-bits being limited to 3 is additionally imposed between bit 1 and bit 8, i.e., in the proximity of the parity bit position, so that the above-described conditions may each be met.

That is, when 1-bits including the parity bit are each delimited by a comma (,), the pattern of {'1' (bit 2), '1' (bit 3), '1' (bit 4), a parity bit, '1' (bit 5)} is inhibited as shown in the second pattern from the top among the five patterns in FIG. 10. That is because the constraint of MTR=4 is not satisfied.

Also inhibited for the same reason are the pattern of {'1' (bit 3), '1' (bit 4), a parity bit, '1' (bit 5), '1' (bit 6)}, the pattern of {'1' (bit 4), a parity bit, '1' (bit 5), '1' (bit 6), '1' (bit 7)}, and the pattern of {a parity bit, '1' (bit 5), '1' (bit 6), '1' (bit 7), '1' (bit 8)}.

It should be noted that the pattern shown at the top, i.e., {'1' (bit 1), '1' (bit 2), '1' (bit 3), '1' (bit 4), a parity bit} is inhibited because of the above-mentioned original constraint of the maximum number of consecutive 1-bits being limited to 2 at the beginning and end of the code word.

Figure 11:
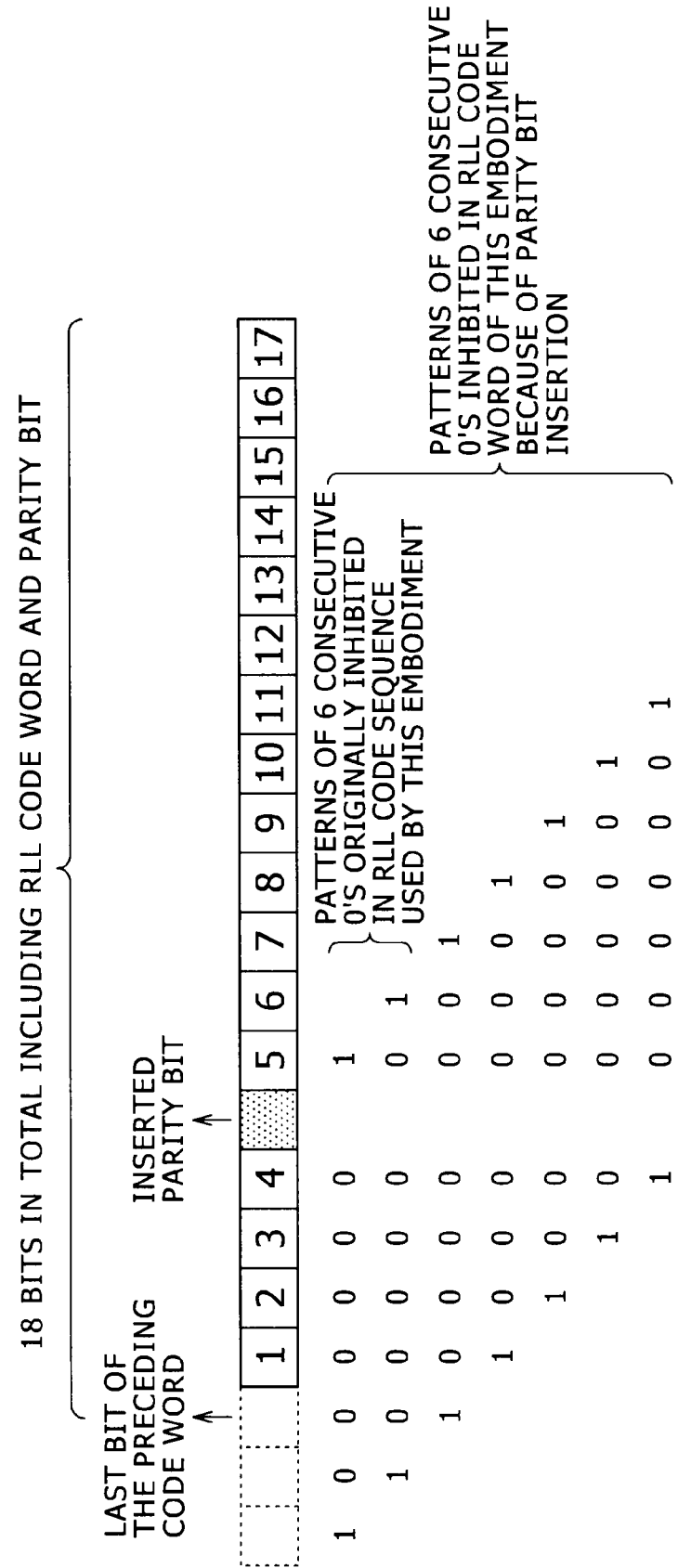
FIG. 11 is a schematic view showing the position in which to insert a 1 parity bit, along with typical additional constraints on consecutive 0-bits.

FIG. 11 is a schematic view showing the position in which to insert a 1 ECC parity bit generated by the ECC parity generation section 52, along with typical additional constraints on consecutive 0-bits.

As shown in FIG. 11, a 1 or a 0 ECC parity bit generated by the ECC parity generation section 52 is inserted between bit 4 and bit 5 relative to the beginning of a 16/17 RLL code output from the RLL coding section 51.

Even where the one ECC parity bit to be inserted is "0," the constraint of the maximum number of consecutive 0-bits being limited to 5 is additionally imposed in the proximity of the parity bit position so that the above-described conditions may each be met. In this case, the proximity of the parity bit position ranges from bit −1 (i.e., the bit immediately preceding the last bit (bit 0) of the preceding code word) to bit 10.

That is, the pattern of {'0' (bit 1), '0' (bit 2), '0' (bit 3), '0' (bit 4), a parity bit, '0' (bit 5), '0' (bit 6)} is inhibited as shown in the third pattern from the top among the seven patterns in FIG. 11. That is because the constraint of the maximum run length of 0-bits being limited to 6 will not be satisfied.

Also inhibited for the same reason are the pattern of {'0' (bit 2), '0' (bit 3), '0' (bit 4), a parity bit, '0' (bit 5), '0' (bit 6), '0' (bit 7)}, the pattern of {'0' (bit 3), '0' (bit 4), a parity bit, '0' (bit 5), '0' (bit 6), '0' (bit 7), '0' (bit 8)}, the pattern of {'0' (bit 4), a parity bit, '0' (bit 5), '0' (bit 6), '0' (bit 7), '0' (bit 8), '0' (bit 9)}, and the pattern of {a parity bit, '0' (bit 5), '0' (bit 6), '0' (bit 7), '0' (bit 8), '0' (bit 9), '0' (bit 10)}.

It should be noted that the pattern shown at the top, i.e., {'0' (bit −1), '0' (bit 0), '0' (bit 1), '0' (bit 2), '0' (bit 3), '0' (bit 4), a parity bit} and the second pattern from the top, i.e., {'0' (bit 0), '0' (bit 1), '0' (bit 2), '0' (bit 3), '0' (bit 4), a parity bit, '0' (bit 5)} are inhibited because of the above-mentioned original constraint of the maximum number of consecutive 0-bits being limited to 6 at the beginning and end of the code word.

As shown in FIGS. 10 and 11, the constraints of the maximum numbers of consecutive 1-bits and 0-bits are additionally imposed on the RLL code in which a parity bit is inserted. This makes it possible to prevent the maximum number of consecutive 1-bits or 0-bits for the entire code sequence after parity bit insertion from becoming larger than the maximum number of consecutive 1-bits or 0-bits before parity bit insertion.

There may be a plurality of parity bit positions in which to insert a parity bit in each code word. A plurality of parity bits may be inserted in each of the parity bit positions involved.

As described, the coding block 21 in FIG. 5 codes an information sequence in such a manner that upon performing ECC coding after carrying out RLL coding of the information sequence, the maximum number of consecutive 1-bits or 0-bits is α−β or less in an RLL code word over a range from bit p−α to bit p+α−1 of the RLL code word and that a β-bit parity sequence is inserted between bit p−1 and bit p of the RLL code word, where α is a number larger than 1 representing the maximum number of consecutive 0-bits or 1-bits in an N-bit RLL code word and where p is a natural number.

In the examples of FIGS. 10 and 11, the number p is 5 and the number β is 1. The number α is 4 with regard to the constraint on 1-bits and 6 regarding the constraint on 0-bits.

As explained above in reference to FIGS. 10 and 11, part of the inhibited patterns regarding the RLL code sequence are inhibited by the original constraints. Thus the number of RLL code words meeting a predetermined run length constraint varies depending on where an ECC parity bit is inserted in each RLL code word.

FIG. 12 is a tabular view showing relations between the parity bit positions in which a 1 parity bit is inserted in the 17-bit code word on the one hand, and the numbers of 17-bit code word candidates on the other hand. These 17-bit code word candidates are designed to satisfy the constraint of the maximum run length of 0-bits being limited to 6 and the constraint of the maximum run length of 1-bits being limited to 4 after parity bit insertion.

From FIG. 12, it will be understood that the largest number of code word candidates amounting to 70,477 can be generated when a parity bit is inserted before bit 5 or after bit 13 of the 16/17 RLL code for this embodiment. Since at least 65,536 (=$2^{16}$) code word candidates are needed to design a 16-bit conversion code to be input to the RLL coding section 51, it will also be understood that the constraints on this embodiment will not be met no matter where the parity bit is inserted in the 16/17 RLL code.

The reason for the above-described phenomenon is that the RLL code for use with this embodiment is originally subject to the constraints on the maximum numbers of consecutive 1-bits and 0-bits at the beginning and end of the code word.

Generally, the RLL code must comply with predetermined code constraints at the connecting point between a given code word and the ensuing code word. Also, the RLL code is often subject to reinforced code constraints at the beginning and end of each code word compared with near the center of the code word. As a result, the number of code word candidates with this embodiment meeting the RLL constraints is influenced by the biased presence of the original code constraints on the RLL code sequence.

For these reasons, in the above-described code example where MTR=4, the largest number of code word candidates can be generated when an ECC parity bit is inserted before bit 5 or after bit 13.

The larger the number of code word candidates, the more constraints that may be additionally imposed on the code. This aspect is advantageous in enhancing the performance of the code in question.

According to the coding method of this embodiment, if m/n is assumed to denote the coding ratio of the RLL code, then the coding ratio of the error correcting code should preferably be m/(n+β). Where m/n stands for the coding ratio of the RLL code and m/(n+β) for the coding ratio of the error correcting code, it is possible periodically to insert β ECC parity bits into the n-bit RLL code word. This arrangement is easy to implement in the form of a circuit.

As mentioned above, it is determined that m=16, n=17 and β=1 for this embodiment. When β=1, it is possible to maximize the final coding ratio for a given m/n. This is most efficient in terms of coding ratio enhancement.

Consider now an example where a total of x-bit ECC parity bits are added to an n-bit code sequence of which the maximum number of consecutive 1-bits or 0-bits is limited to α.

In the above case, if the technique of Non-Patent Document 3 is used as a comparative example 1, then the run length constraint on the code sequence following parity insertion is always degraded to a+1 or more.

By contrast, the coding method of this embodiment does not degrade the run length constraint on the code sequence after parity insertion; the run length limit remains at $\alpha$.

If the technique of Non-Patent Document 4 is used as a comparative example 2, it is necessary to insert an additional bit at both ends of a parity sequence and at in intervals of $\alpha$ parity bits to comply with the run length constraint on the code sequence after parity insertion. That is, at least 1+Ceil $(x/\alpha)$ additional bits are needed. That means the actual coding ratio of the ECC deteriorates from n/(n+x) to n/{n+x+1+Ceil $(x/\alpha)$}.

For example, if a 148-bit ECC parity bit sequence is to be inserted into a 2,516-bit code sequence of which the maximum number of consecutive 1-bits is limited to 4. then 38 (=1+148/4) additional bits are needed. In this case, the actual coding ratio deteriorates from 2516/(2516+148)=17/18=0.94444 to 2516/(2516+148+38)=0.93116. The worsening coding ratio can lead to a drop in signal transmission speed, a degraded signal-to-noise ratio of the storage system upon recording or reproduction, or other kinds of deterioration in system performance.

According to the coding method of this embodiment, by contrast, no addition bits except for parity bits are needed to comply with the run length constraint on the code sequence.

Where the technique of Patent Document 2 is used as a comparative example 3, the ECC parity bits are arranged to undergo conversion. Thus upon soft-decision decoding, it is necessary to calculate the confidence of each of a plurality of consecutive information bits by referencing the received signal sequence made up of multiple consecutive bits. This makes it difficult to design a circuit capable of performing soft-decision decoding accurately.

According to the coding method of this embodiment, by contrast, the ECC parity bits are simply inserted into the code sequence (i.e., the ECC parity bits are not subject to conversion). Thus when the decoding side conducts soft-decision decoding, the input signal having undergone A/D conversion over the parity bit portion can be used unmodified for confidence calculation. This makes it easy to design a circuit capable of conducting soft-decision decoding with precision.

[Recording Process]

Figure 13:
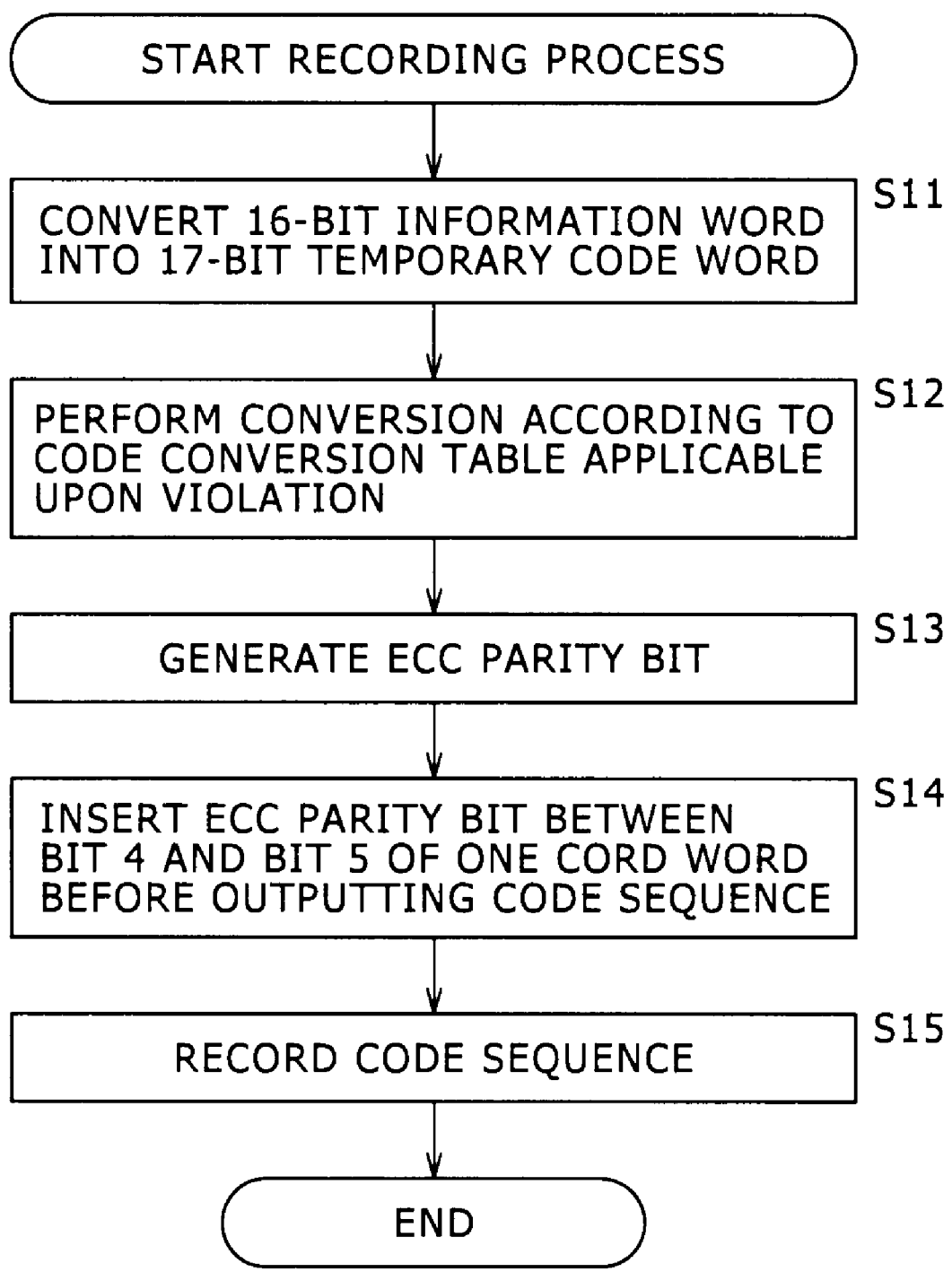
FIG. 13 is a flowchart explanatory of a recording process performed by the recording device having the coding block shown in FIG. 5.

Explained below in reference to FIG. 13 is the recording process performed by the recording device 11 having the coding block 21 of FIG. 5.

In step S11, the RLL coding section 51 in the coding block 21 converts a 16-bit information word into a 17-bit temporary code word in accordance with the code conversion table of FIG. 8. The code conversion table used here involves imposing additional constraints on the bits in the vicinity of the position in which to insert a parity bit. As such, the table inhibits the conversion into the temporary code words having the inhibited patterns discussed earlier by referring to FIGS. 10 and 11.

In step S12, if the constraint on the connecting point between temporary code words is found violated, then the RLL coding section 51 performs conversion in keeping with the code conversion table applicable upon violation in FIG. 9. An RLL code sequence generated by the RLL coding section 51 executing RLL coding is sent to both the ECC parity generation section 52 and the selection section 53.

In step S13, the ECC parity generation section 52 generates and outputs an ECC parity bit.

In step S14, the selection section 53 inserts a 1 ECC parity bit fed from the ECC parity generation section 52 between bit 4 and bit 5 of an RLL code sequence made of a single code word supplied from the RLL coding section 51. The selection section 53 outputs the code sequence with the ECC parity bit inserted therein.

In step S15, the recording block 22 records to a recording medium the code sequence output from the selection section 53. This terminates the recording process.

[Composition on the Decoding Side]

Figure 14:
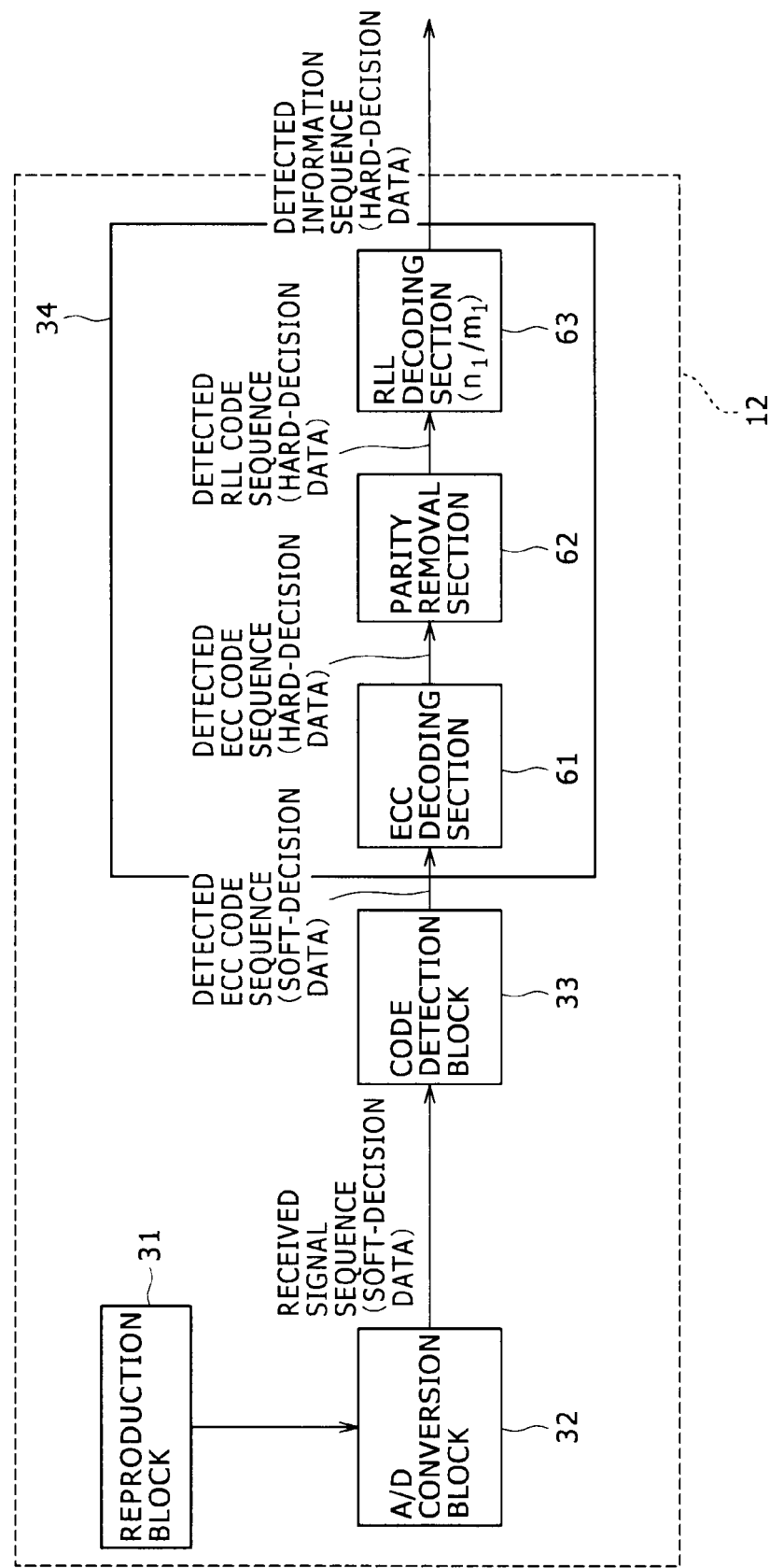
FIG. 14 is a block diagram showing a composition example of a reproduction device as part of the recording and reproduction system embodying the present invention.

FIG. 14 is a block diagram showing a composition example of the reproduction device 12 reproducing the code sequence coded by the coding block 21 shown in FIG. 5.

Figure 1:
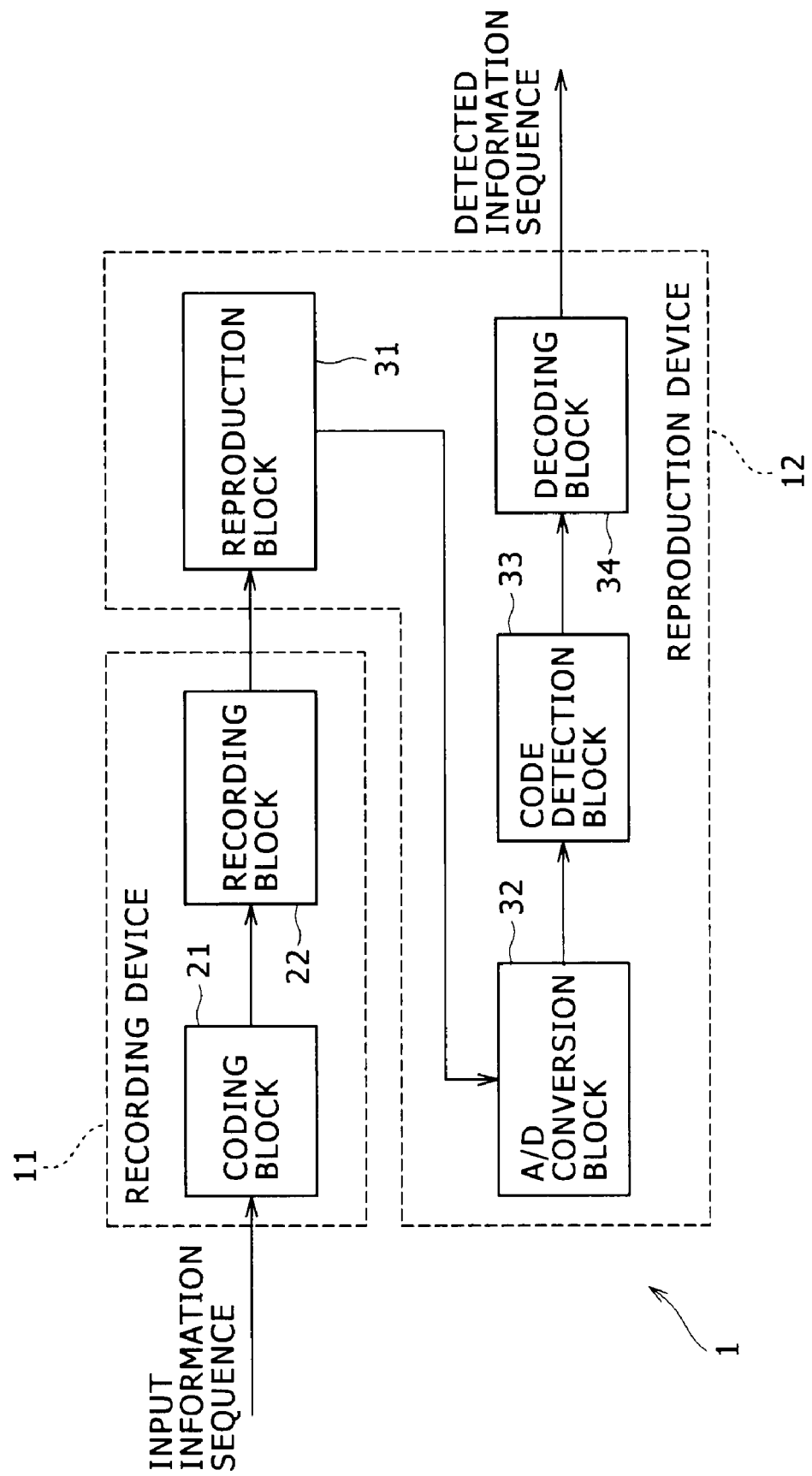
FIG. 1 is a block diagram showing a configuration example of a recording and reproduction system.

In the structure indicated in FIG. 14, those components included in the structure of FIG. 1 are designated by like reference numerals. As shown in FIG. 14, the decoding block 34 in the reproduction device 12 is made up of an ECC decoding section 61, a parity removal section 62, and an RLL decoding section 63.

As mentioned above, the recorded signal coming from the recording device 11 is converted by the reproduction block 31 of the reproduction device 12 into an analog reproduced signal. The analog reproduced signal is equalized by an analog equalizer, not shown, to a signal having predetermined target equalization characteristics. The analog reproduced signal thus equalized is converted into a digital received signal by the A/D conversion block 32 at predetermined time intervals. The received sequence signal represented by the digital received signal obtained through A/D conversion by the A/D conversion block 32 is input to the code detection block 33.

The code sequence acquired by the coding method of this embodiment can be decoded through either hard-decision or soft-decision. In this case, soft-decision decoding is assumed to be carried out.

The received signal sequence input to the code detection block 33 is converted to a detected ECC code sequence made of soft-decision data before being output. Although the code detection block 33 may also be arranged to output hard-decision data, what is output here is the soft-decision data representative of posterior probability information about the received signal.

The detected ECC code sequence output from the code detection block 33 is input to the ECC decoding section 61 of the decoding block 34 for error detection and correction. In turn, the ECC decoding section 61 outputs a detected ECC code sequence made of hard-decision data. Although the ECC decoding section 61 may also be arranged to output soft-decision data, what is output here is hard-decision data.

The detected ECC code sequence output from the ECC decoding section 61 is input to the parity removal section 62 whereby the ECC parity bit is removed. The parity removal section 62 then outputs a detected RLL code sequence constituted by hard-decision data. As explained above in reference to FIGS. 10 and 11, an ECC parity bit is inserted simply into the RLL code sequence obtained by the coding method of this embodiment. It follows that the reversal of the parity bit insertion (i.e., of the ECC parity bit) upon decoding can be accomplished by simply getting the parity removal section 62 to remove the ECC parity bit from the input code sequence.

The detected RLL code sequence that is the hard-decision data output from the parity removal section 62 is input to the RLL decoding section 63 for RLL decoding at the ratio of $n_1/m_1$. The detected information sequence formed by the hard-decision data acquired through RLL decoding is output to subsequent circuitry.

As in the case of the decoding of the code sequence obtained by the ordinary coding method of FIG. 2, the code sequence acquired by the coding method of this embodiment can be decoded using a soft-decision decoder of a similarly simplified structure. Where the coding method of this embodiment is utilized, however, the run length constraint on the code sequence will not be degraded unlike in the case of the ordinary method shown in FIG. 2.

Figure 15:
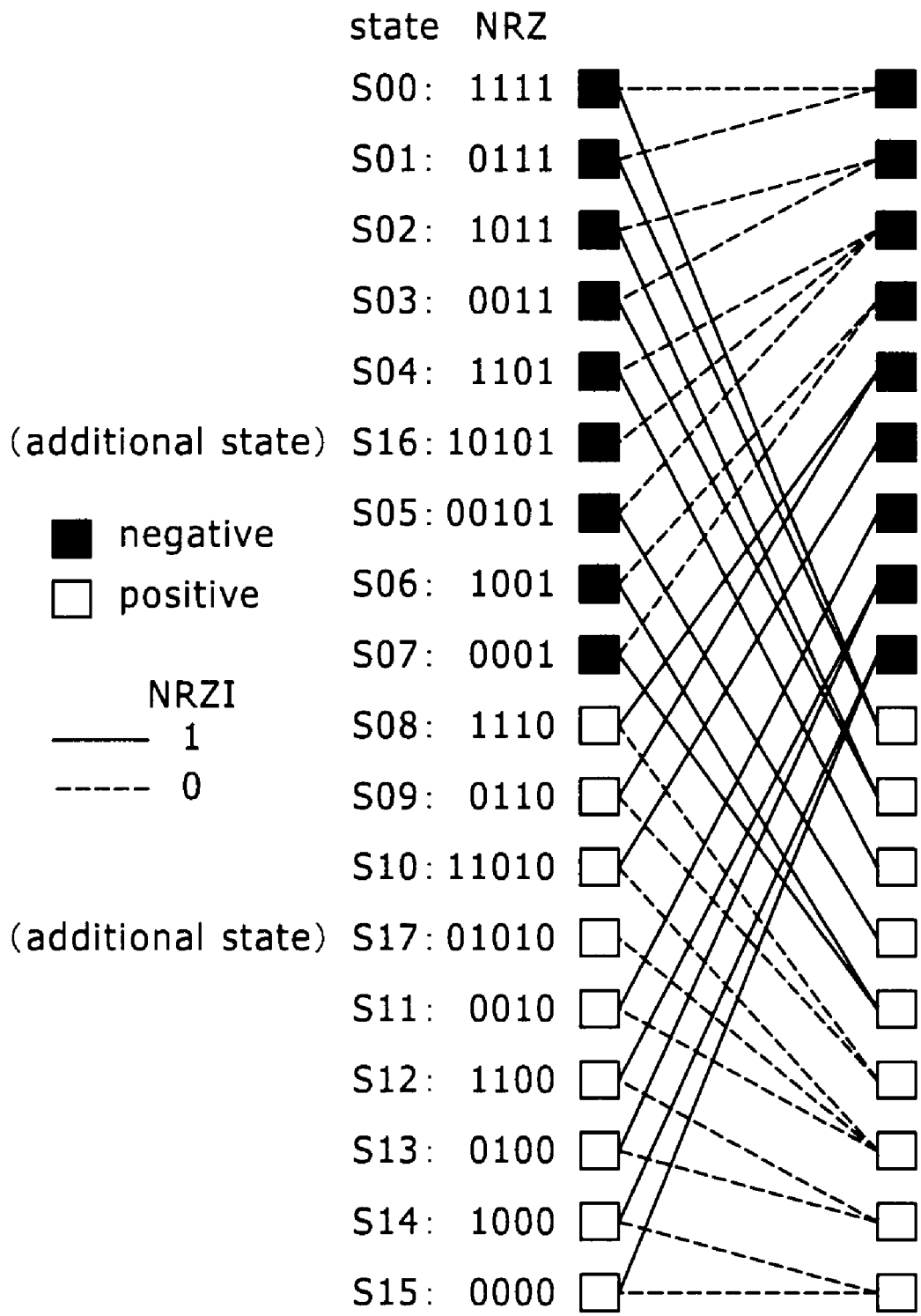
FIG. 15 is a trellis diagram of 18 states.

FIG. 15 is a trellis diagram of 18 states for use by the code detection block 33 shown in FIG. 14.

In FIG. 15, each hollow square (□) indicates the positive state and each solid square (■) denotes the negative state. A solid line connecting the two states represent a 1-bit in a sequence before NRZI modulation, and a broken line connecting the two states stands for a 0-bit in the sequence before NRZI modulation. The trellis diagram of FIG. 15 reflects four-bit intersymbol interference and the constraint of the maximum number of consecutive 1-bits being limited to 4 as indicated in FIG. 6.

Generally, the trellis diagram taking into account the four-bit intersymbol interference for effecting soft-decision detection has 16 ($=2^4$) states. The 16 states being additionally subject to the constraint of the maximum number of consecutive 1-bits being limited to 4 make up the trellis diagram in FIG. 15 having 18 states. When conducting soft-decision detection in accordance with the 18-state trellis diagram of FIG. 15, a magnetic recording system may typically obtain a coding gain of about 0.3 dB.

Where the coding method of this embodiment is used, there is no possibility of degrading the maximum run length of the code sequence after EEC parity bit insertion. Thus if the maximum number of consecutive 1-bits is 4 for the RLL coding section 51 in FIG. 5, then the trellis diagram of FIG. 15 can be utilized upon code detection.

Meanwhile, if the ordinary method of FIG. 2 is employed, the use of the trellis diagram of FIG. 15 for code detection requires limiting the maximum number of consecutive 1-bits to 3 for the RLL coding section 51 in FIG. 2. In this case, it is impossible to limit the maximum number of consecutive 0-bits to 6, the same count as that of the coding method of this embodiment, at the same coding ratio offered by this embodiment.

[Reproduction Process]

Figure 16:
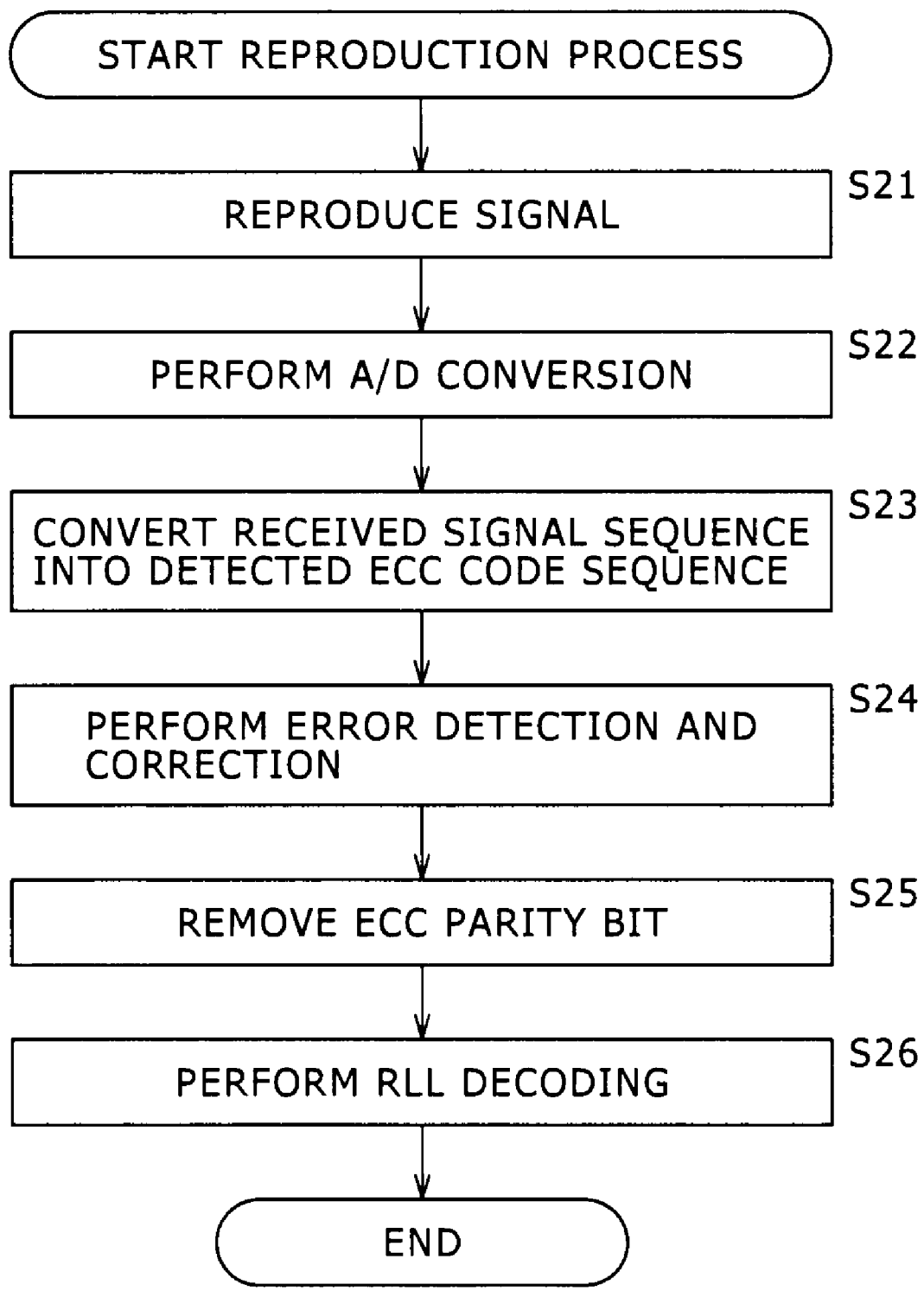
FIG. 16 is a flowchart explanatory of a reproduction process performed by the reproduction device shown in FIG. 14.

The reproduction process performed by the reproduction device 12 shown in FIG. 14 will now be described in reference to the flowchart of FIG. 16.

In step S21, the reproduction block 31 reproduces an analog reproduced signal recorded on the recording medium, equalizes the reproduced signal, and outputs the equalized signal.

In step S22, the A/D conversion block 32 puts the analog reproduced signal to A/D conversion. A received signal sequence resulting from the conversion is output by the A/D conversion block 32.

In step S23, the code detection block 33 detects a code sequence using the 18-state trellis diagram such as one shown in FIG. 15. Following the detection, the code detection block 33 outputs a detected ECC code sequence made of soft-decision data.

In step S24, the ECC decoding section 61 in the decoding block 34 performs error detection and correction on the detected ECC code sequence fed from the code detection block 33. Following the error detection and correction, the ECC decoding section 61 outputs a detected ECC code sequence made of hard-decision data.

In step S25, the parity removal section 62 removes the ECC parity bit inserted in the detected ECC code sequence supplied from the ECC decoding section 61. The parity removal section 62 outputs the detected ECC code sequence devoid of ECC parity bits.

In step S26, the RLL decoding section 63 performs RLL decoding, at the ratio of $n_1/m_1$, of the detected ECC code sequence from which the ECC parity bit has been removed. In this step, the conversion based on the code conversion table applicable upon violation in FIG. 9 is reversed. Also reversed is the conversion based on the code conversion table in FIG. 8. The RLL decoding section 63 outputs a detected information sequence obtained through RLL decoding, and terminates the reproduction process.

[Variations]

The coding method and decoding method discussed above may also be applied to transmission and reception systems that transmit and receive data.

Figure 17:
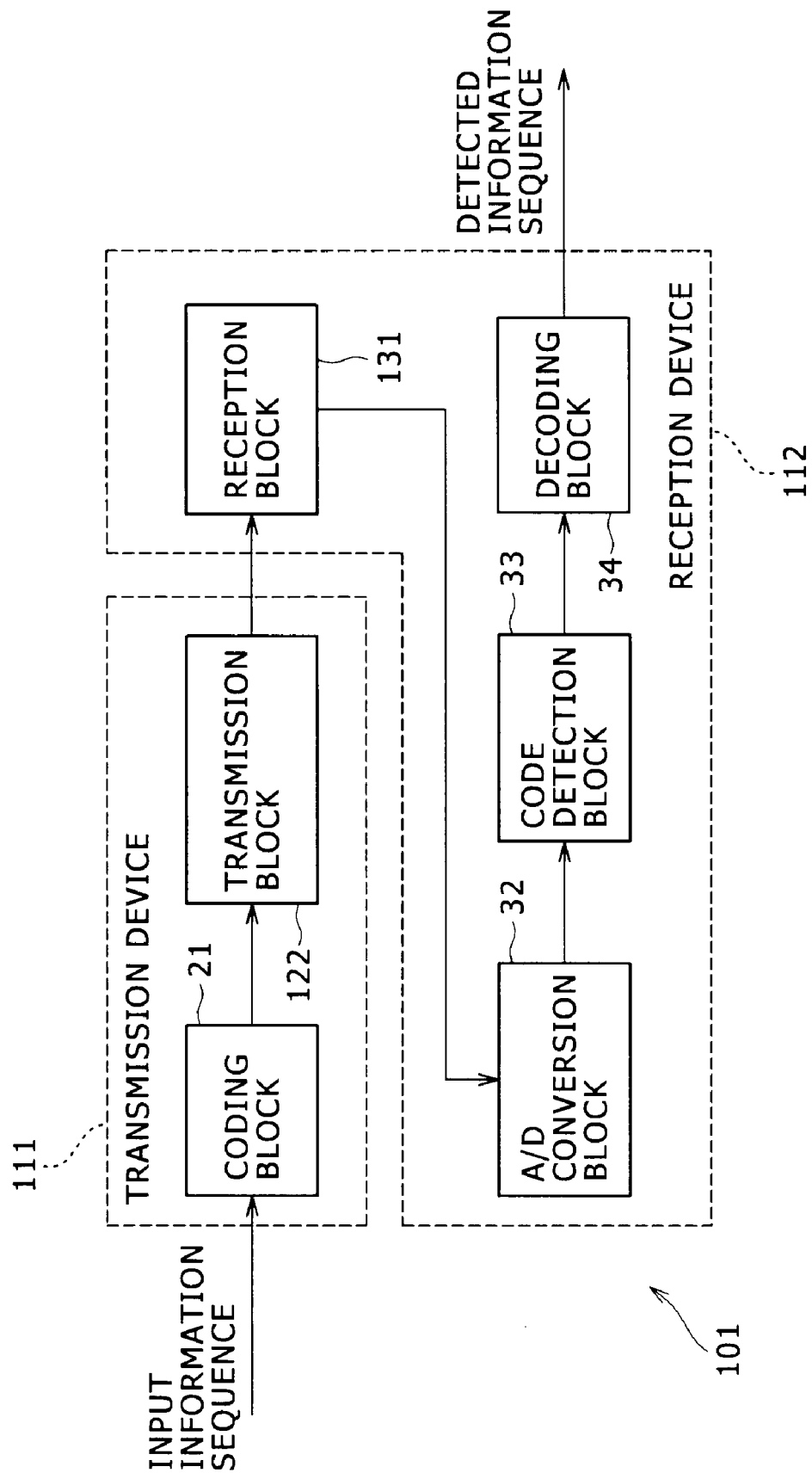
FIG. 17 is a block diagram showing a configuration example of a transmission and reception system.

FIG. 17 is a block diagram showing a configuration example of a transmission and reception system 101 embodying the present invention.

In the configuration of FIG. 17, the same or equivalent components as those found in the configuration of FIG. 1 showing the recording and reproduction system 1 are designated by like reference numerals, and their descriptions will be omitted hereunder where redundant.

As shown in FIG. 17, the transmission and reception system 101 is constituted by a transmission device 111 and a reception device 112. The transmission device 111 includes a transmission block 122 replacing the recording block 22 in FIG. 1. The reception device 112 includes a reception block 131 replacing the reproduction block 31 in FIG. 1.

The transmission block 122 in the transmission device 111 transmits the signal representing the code sequence coming from the coding block 21 into the air illustratively via a transmission antenna. In this setup, the transmission and reception system 101 functions as a wireless communication system.

The reception block 131 in the reception device 112 converts into an analog signal the signal received from the air by way of a reception antenna. The analog signal acquired from the conversion is fed to the A/D conversion block 32.

The transmission device 111 and reception device 112 may be combined integrally to form a transmission and reception device. As another alternative, the recording device 11 and reception device 12 in FIG. 1 may be combined integrally to constitute a recording and reproduction device.

The above-described coding method and decoding method of the embodiments of the present invention can be applied illustratively to magnetic recording and reproduction devices such as magnetic disk recording and reproduction devices and magnetic tape recording and reproduction devices. The methods can also be applied to such optical disk devices as magneto-optical disk recording and reproduction devices, phase change optical disk recording and reproduction devices, and read-only optical disk reproduction devices. Furthermore, the coding and decoding methods may be applied to diverse kinds of communication equipment including TV transmitters, mobile phones, and LAN's (local area networks).

The series of steps and processes described above may be executed either by hardware or by software. Where the software-based processing is to be carried out, the programs constituting the software may be either incorporated beforehand in dedicated hardware of a computer for program execution or installed upon use from a suitable program storage medium into a general-purpose personal computer or like equipment capable of executing diverse functions based on the installed programs.

FIG. 18 is a block diagram showing a composition example of a computer that carries out the above-described series of steps and process using suitable programs.

In the structure of FIG. 18, a CPU (central processing unit) 311, a ROM (read only memory) 312, and a RAM (random access memory) 313 are interconnected by a bus 314.

An input/output interface 315 is also connected to the bus 314. The input/output interface 315 is connected with an input unit 316 typically composed of a keyboard and a mouse, and with an output unit 317 formed illustratively by a display and speakers. The input/output interface 315 is further connected with a storage unit 318 typically made of a hard disk and/or a nonvolatile memory, with a communication unit 319 constituted illustratively by a network interface, and with a drive 320 that drives removable media 321.

In the computer structured as outlined above, the CPU 311 loads relevant programs illustratively from the storage unit 318 into the RAM 313 via the input/output interface 315 and bus 314. When loaded into the RAM 313, the programs are executed by the CPU 311 that performs the above-described series of steps and processes.

The computer programs executed by the CPU 311 may be retained illustratively on the removable media 321 and offered to users via wired or wireless communication media such as local area networks, the Internet, and digital satellite broadcasts. The programs thus offered are installed into the storage unit 318 of the computer.

Also, the programs for execution by the computer may be processed in the depicted sequence of this specification (i.e., on a time series basis), in parallel, or in otherwise appropriately timed fashion such as when they are invoked.

The present application contains subject matter related to that disclosed in Japanese Priority Patent Application JP 2009-259908 filed in the Japan Patent Office on Nov. 13, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A coding method comprising the step of:
coding an information sequence in such a manner that upon performing error correction coding after carrying out RLL coding of said information sequence, the maximum number of consecutive 1-bits or 0-bits is $\alpha-\beta$ or less in an RLL code word over a range from bit $p-\alpha$ to bit $p+\alpha-1$ of said RLL code word and that a $\beta$-bit error correcting code parity sequence is inserted between bit $p-1$ and bit $p$ of said RLL code word, where $\alpha$ is a number larger than 1 representing the maximum number of consecutive 0-bits or 1-bits in an n-bit RLL code word and where p is a natural number.

2. The coding method according to claim 1, where p represents a plurality of natural numbers.

3. The coding method according to claim 1, wherein, if the coding ratio of said RLL code is represented by m/n where m is a natural number, then the coding ratio of the error correcting code is defined as m/(n+β).

4. The coding method according to claim 3, wherein β is 1.

5. The coding method according to claim 4, wherein m is 16 and n is 17.

6. The coding method according to claim 5, wherein the maximum number α of consecutive 1-bits is 4 and the maximum number α of consecutive 0-bits is 6, and wherein p is 5.

7. A coding apparatus comprising:
coding means for coding an information sequence in such a manner that upon performing error correction coding after carrying out RLL coding of said information sequence, the maximum number of consecutive 1-bits or 0-bits is $\alpha-\beta$ or less in an RLL code word over a range from bit $p-\alpha$ to bit $p+\alpha-1$ of said RLL code word and that a $\beta$-bit error correcting code parity sequence is inserted between bit $p-1$ and bit $p$ of said RLL code word, where $\alpha$ is a number larger than 1 representing the maximum number of consecutive 0-bits or 1-bits in an n-bit RLL code word and where p is a natural number.

8. A decoding method comprising the steps of:
detecting a code sequence obtained by coding an information sequence in such a manner that upon performing error correction coding after carrying out RLL coding of said information sequence, the maximum number of consecutive 1-bits or 0-bits is $\alpha-\beta$ or less in an RLL code word over a range from bit $p-\alpha$ to bit $p+\alpha-1$ of said RLL code word and that a $\beta$-bit error correcting code parity sequence is inserted between bit $p-1$ and bit $p$ of said RLL code word, where $\alpha$ is a number larger than 1 representing the maximum number of consecutive 0-bits or 1-bits in an n-bit RLL code word and where p is a natural number;
deleting the error correcting code parity sequence from the detected code sequence; and
performing RLL decoding of the code sequence from which said error correcting code parity sequence has been deleted.

9. A decoding apparatus comprising:
detection means for detecting a code sequence obtained by coding an information sequence in such a manner that upon performing error correction coding after carrying out RLL coding of said information sequence, the maximum number of consecutive 1-bits or 0-bits is $\alpha-\beta$ or less in an RLL code word over a range from bit $p-\alpha$ to bit $p+\alpha-1$ of said RLL code word and that a $\beta$-bit error correcting code parity sequence is inserted between bit $p-1$ and bit $p$ of said RLL code word, where $\alpha$ is a number larger than 1 representing the maximum number of consecutive 0-bits or 1-bits in an n-bit RLL code word and where p is a natural number;
deletion means for deleting the error correcting code parity sequence from said code sequence detected by said detection means; and
decoding means for performing RLL decoding of said code sequence from which said error correcting code parity sequence has been deleted by said deletion means.

10. A coding apparatus comprising:
a coding block configured to code an information sequence in such a manner that upon performing error correction coding after carrying out RLL coding of said information sequence, the maximum number of consecutive 1-bits or 0-bits is $\alpha-\beta$ or less in an RLL code word over a range from bit $p-\alpha$ to bit $p+\alpha-1$ of said RLL code word and that a $\beta$-bit error correcting code parity sequence is inserted between bit $p-1$ and bit $p$ of said RLL code word, where $\alpha$ is a number larger than 1 representing the maximum number of consecutive 0-bits or 1-bits in an n-bit RLL code word and where p is a natural number.

11. A decoding apparatus comprising:
a detection section configured to detect a code sequence obtained by coding an information sequence in such a manner that upon performing error correction coding after carrying out RLL coding of said information sequence, the maximum number of consecutive 1-bits or 0-bits is $\alpha-\beta$ or less in an RLL code word over a range from bit $p-\alpha$ to bit $p+\alpha-1$ of said RLL code word and that a $\beta$-bit error correcting code parity sequence is inserted between bit $p-1$ and bit $p$ of said RLL code word, where $\alpha$ is a number larger than 1 representing the maximum number of consecutive 0-bits or 1-bits in an n-bit RLL code word and where p is a natural number;

a deletion section configured to delete the error correcting code parity sequence from said code sequence detected by said detection section; and a decoding section configured to perform RLL decoding of said code sequence from which said error correcting code parity sequence has been deleted by said deletion section.

* * * * *